US006606123B2

United States Patent
Mizuno

(10) Patent No.: US 6,606,123 B2
(45) Date of Patent: Aug. 12, 2003

(54) PHOTOSENSITIVE DEVICE

(75) Inventor: Seiichiro Mizuno, Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 107 days.

(21) Appl. No.: 09/916,281

(22) Filed: Jul. 30, 2001

(65) Prior Publication Data

US 2002/0012058 A1 Jan. 31, 2002

Related U.S. Application Data

(63) Continuation-in-part of application No. PCT/JP00/00468, filed on Jan. 28, 2000.

(30) Foreign Application Priority Data

Jan. 29, 1999 (JP) .......................................... P11-022402

(51) Int. Cl.[7] ................................................ H04N 3/14
(52) U.S. Cl. ...................................................... 348/308
(58) Field of Search ................................. 348/308, 294, 348/300–307, 241; 250/208.1, 214.1, 214 A, 214 R; 257/229, 239; 341/122, 144, 150, 159, 161, 162

(56) References Cited

U.S. PATENT DOCUMENTS

| 4,681,440 | A | * | 7/1987 | Burke et al. .............. 250/214.1 |
| 5,038,214 | A | * | 8/1991 | Miida ...................... 348/207.1 |
| 5,343,201 | A | | 8/1994 | Takayama et al. .......... 341/200 |
| 5,387,933 | A | * | 2/1995 | Fouilloy et al. ............. 348/294 |
| 5,424,530 | A | | 6/1995 | Mizuno ................... 250/214 R |
| 5,479,208 | A | * | 12/1995 | Okumura ..................... 348/308 |
| 5,619,262 | A | * | 4/1997 | Uno ............................ 348/308 |
| 5,831,258 | A | * | 11/1998 | Street .......................... 348/308 |
| 6,002,435 | A | * | 12/1999 | Yamamoto et al. .......... 348/308 |
| 6,201,573 | B1 | | 3/2001 | Mizuno ....................... 348/308 |
| 6,476,864 | B1 | * | 11/2002 | Borg et al. ................... 348/308 |

FOREIGN PATENT DOCUMENTS

| JP | 3-104387 | 5/1991 |
| JP | 4-322575 | 11/1992 |
| JP | 5-102853 | 4/1993 |
| JP | 6-276443 | 9/1994 |

* cited by examiner

Primary Examiner—Aung S. Moe
(74) Attorney, Agent, or Firm—Morgan, Lewis & Bockius LLP

(57) ABSTRACT

A device has N photodiodes $PD_1$ to $PD_N$, and also an intagrating circuit $10_n$, switch $SW_{n2}$, capacitor $C_{n2}$, intagrating circuit $20_n$, and sample and hold circuit $30_n$ in correspondence with each photodiode $PD_n$. The device also has a maximum value detection circuit 100, maximum value detection circuit 200, timing control circuit 300, A/D conversion circuit 400, and shift register 500. The maximum value detection circuit 200 outputs a maximum voltage value $V_{max2}$ as a maximum value of signal voltages $V_{n2}$ output from the integrating circuits $20_n$. The A/D conversion circuit 400 sets its A/D conversion range based on this maximum voltage value $V_{max2}$, and sequentially A/D-converts the signal voltages $V_{n2}$. This invention provides a photosensitive device which is never saturated even when the intensity of incident light is large, and can assure high A/D conversion resolution even when the intensity of incident light is small.

4 Claims, 7 Drawing Sheets

PHOTOSENSITIVE DEVICE

RELATED APPLICATION

This is a continuation-in-part application of application serial no. PCT/JP00/00468 filed on Jan. 28, 2000, now pending.

BACKGROUND OF THE INVENTION

1. Field of the Invention

The present invention relates to a photosensitive device for outputting a one- or two-dimensional image as a digital signal.

2. Related Background Art

A photosensitive device such as a solid-state imaging device or the like has an array of a plurality of photosensitive elements, each of which outputs a signal voltage corresponding to the intensity of incident light. Some solid-state imaging device converts the signal voltage as an analog signal into a digital signal (by A/D conversion), and outputs the digital signal. If a signal voltage exceeds a predetermined value upon A/D conversion, a digital signal to be output, which is obtained by A/D conversion based on that signal voltage, is saturated to a value corresponding to the predetermined value and, as a result, an accurate sensed image cannot be obtained. Hence, conventionally, a signal voltage equal to or more than its expected maximum value is set as the predetermined value to prevent such saturation. Also, the dynamic range is increased using a technique such as logarithmic compression or the like.

The solid-state imaging device is used in, e.g., a active distance measurement device built in a camera. In this distance measurement device, two solid-state imaging devices sense an image of spot light which is projected from a light-emitting diode $LED_n$ or the like toward an object, and is reflected by the object, and distance measurement is done based on the two sensed images. At this time, since the image with the spot light is superposed spot light components upon background light components, the two solid-state imaging device sense only background light components while no spot light is projected, and the difference between the images with and without the spot light components is calculated to obtain images of only the spot light components, thus improving the distance measurement precision.

SUMMARY OF THE INVENTION

However, in A/D conversion in the conventional photosensitive device, since a large value is set as the predetermined value to prevent saturation, when the intensity of incident light on each photodetective element is small, i.e., when the signal voltage value is small, the resolution of a digital signal output impairs.

Furthermore, the following problem is posed when an image of only spot light components is obtained by subtracting the image sensing result of background light components from that of the spot light components and background light components like in a case wherein the photosensitive device is used in the distance measurement device. That is, when the background light components are larger than the spot light components, the signal voltage output upon detecting the spot light superposed with the background light components becomes very large and, hence, a large value must be set as the predetermined value to prevent saturation. Therefore, the resolution of a digital signal output based on the spotlight components obtained as the difference further impairs.

The present invention has been made to solve the aforementioned problems, and has as its object to provide a photosensitive imaging device which is free from saturation even when the intensity of incident light is large, and can assure high A/D conversion resolution even when the intensity of incident light is small.

A photosensitive device of the present invention is characterized by comprising (1) a one- or two-dimensional array of N (N≧2) photosensitive elements for respectively outputting signal currents corresponding to the amount of light they receive, (2) N first integrating circuits which are arranged in correspondence with the N photosensitive elements, integrate charges in correspondence with the signal currents output from the photosensitive elements, and output signal voltages, (3) a first maximum value detection circuit for detecting a maximum value of the signal voltages output from the N integrating circuits, and (4) an A/D conversion circuit for setting an A/D conversion range on the basis of the maximum value detected by the first maximum value detection circuit, converting the signal voltages output from the N first integrating circuits into digital signals, and outputting the digital signals.

The photosensitive device comprises N (N≧2) sets of photosensitive elements and first integrating circuits. Each first integrating circuit integrates a charge in correspondence with a signal current which is output from each photosensitive element in correspondence with the intensity of incident light, and outputs a signal voltage. The first maximum value detection circuit detects the maximum value of the signal voltages output from the N first integrating circuits. The A/D conversion circuit sets the A/D conversion range on the basis of the maximum value detected by the first maximum value detection circuit, converts the signal voltages output from the N first integrating circuits into digital signals, and outputs the digital signals. Note that a signal to be selected and detected by the first maximum value detection circuit may be the second largest numerical value in place of the maximum value, or a numerical value of an appropriate order may be used if necessary. More specifically, the first maximum value detection circuit can be a first detection circuit for selecting and detecting a specific signal from N signal voltages.

The photosensitive device of the present invention may be characterized by further comprising (1) N second integrating circuits which are arranged in correspondence with the N photosensitive elements, integrate charges in correspondence with the signal currents output from the photosensitive elements, and output signal voltages, (2) switches and capacitors inserted in turn between N sets of neighboring second and first integrating circuits, (3) a second maximum value detection circuit for detecting a maximum value of the signal voltages output from the N second integrating circuits, and (4) a timing control circuit for controlling operation timings of the first and second integrating circuits on the basis of the maximum value detected by the second maximum value detection circuit.

In this case, the photosensitive device comprises N sets of photosensitive elements, second integrating circuits, switches, capacitors, and first integrating circuits, which are connected in the order named. The capacitor and first integrating circuit of each set constitute a so-called CDS (Correlated Double Sampling) circuit. Each second integrating circuit receives a signal current which is output from each photosensitive element in correspondence with the intensity of incident light, integrates a charge based on the signal current, and outputs a signal voltage. The second maximum value detection circuit detects the maximum value of the signal voltages output from the N second integrating circuits. The timing control circuit controls the operation timings of the first and second integrating circuits on the basis of the maximum value detected by the second maximum value detection circuit. As a result, various noise components are removed from the signal voltages output from the second integrating circuits. Note that a signal to be selected and detected by the second maximum value detection circuit may be the second largest numerical value in place of the maximum value, or a numerical value of an appropriate order may be used if necessary. More specifically, the second maximum value detection circuit can be a second detection circuit for selecting and detecting a specific signal from N signal voltages.

The photosensitive device of the present invention is a photosensitive device used together with projection means for projecting spot light toward an object, and is also preferably characterized in that a timing control circuit (1) controls the N second integrating circuits to integrate first charge amounts on the basis of signal currents output from the N photosensitive elements upon receiving spot light components and background light components during a first period in which the projection means projects the spot light onto the object, and (2) then controls the N second integrating circuits to integrate second charge amounts on the basis of signal currents output from the N photosensitive elements upon receiving background light components and controls the N first integrating circuits to integrate charge amounts as differences between the first and second charge amounts during a second period in which the projection means does not project spot light onto the object. In this case, even when the background light components of incident light on each photosensitive element are larger than the spot light components, each first integrating circuit can obtain an image of only spot light components by subtracting the image sensing result of the background light components from that of the spot light components and background light components. A digital signal output from the A/D conversion circuit based on the spot light components obtained as the difference can have high resolution.

DESCRIPTION OF THE PREFERRED EMBODIMENT

Figure 1:
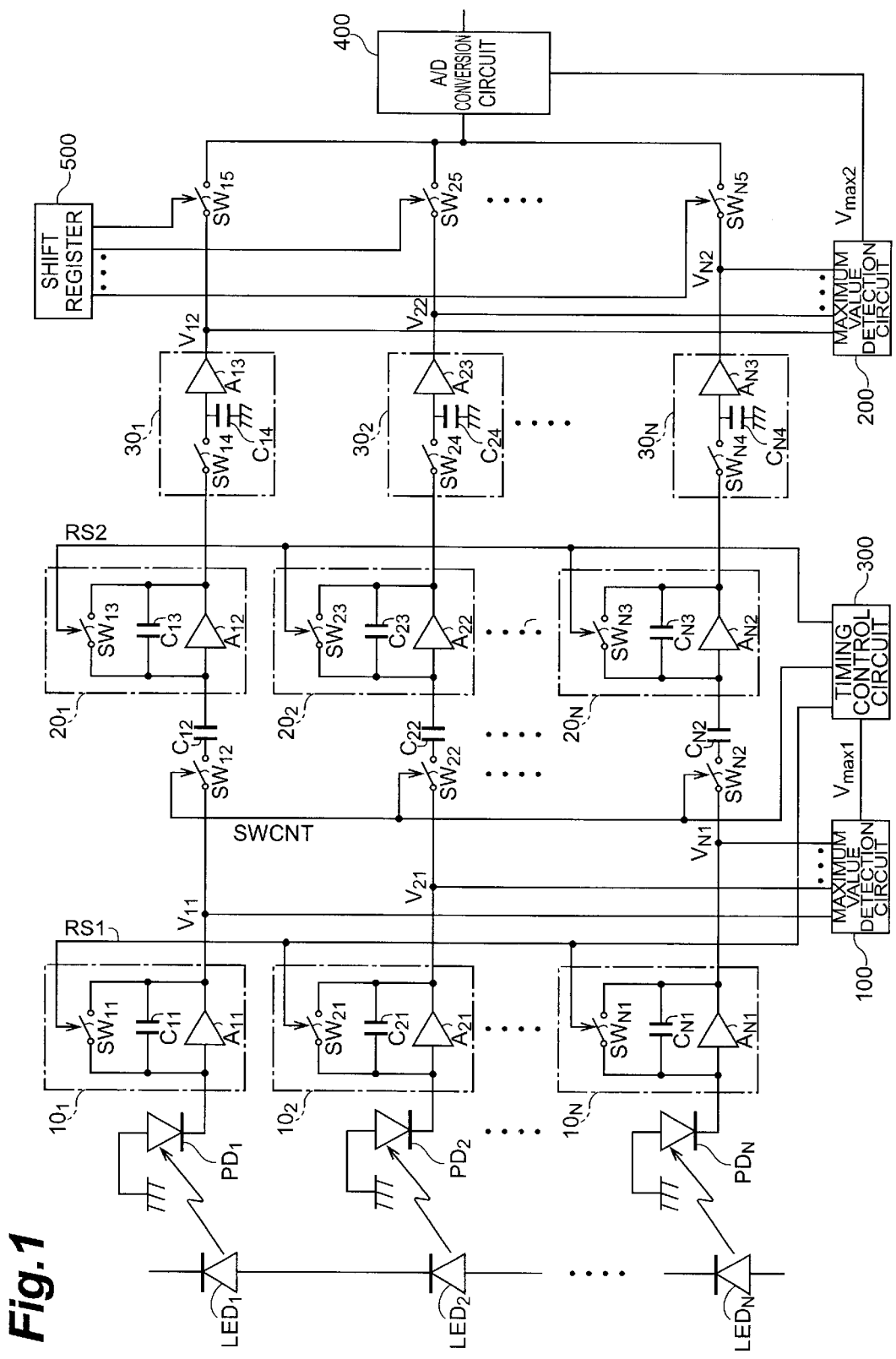
FIG. 1 is a circuit diagram of a solid-state imaging device according to an embodiment of the present invention.

An embodiment of the present invention will be described in detail hereinafter with reference to the accompanying drawings. Note that the same reference numerals denote the same parts in a description of the drawings, and a repetitive description will be omitted.

FIG. 1 is a circuit diagram of a solid-state imaging device as a photosensitive device according to an embodiment of the present invention. The solid-state imaging device according to this embodiment comprises N photodiodes (photosensitive elements) $PD_1$ to $PD_N$, and comprises an integrating circuit (second integrating circuit) $10_n$, switch $SW_{n2}$, capacitor $C_{n2}$, integrating circuit (first integrating circuit) $20_n$, and sample and hold circuit $30_n$ in correspondence with each photodiode $PD_n$. Note that N is an integer equal to or larger than 2 and n is an arbitrary integer between 1 and N (both inclusive), and the same applies to the following description. The solid-state imaging device also comprises a maximum value detection circuit, (second maximum detection circuit, second detection circuit) 100, maximum value detection circuit (first maximum detection circuit, first detection circuit) 200, timing control circuit 300, A/D conversion circuit 400, and shift register 500. The capacitor $C_{n2}$ and integrating circuit $20_n$ constitute a so-called correlated double sampling (CDS) circuit.

The anode terminal of the photodiode $PD_n$ is connected to ground, and its cathode terminal is connected to the input terminal of the integrating circuit $10_n$. The photodiode $PD_n$ outputs a signal current corresponding to the intensity of incident light to the input terminal of the integrating circuit $10_n$ via the anode terminal.

The integrating circuit $10_n$ comprises a parallel circuit of an amplifier $A_{n1}$, capacitor $C_{n1}$, and switch $SW_{n1}$, between its input and output terminals. When the switch $SW_{n1}$ is closed, the capacitor $C_{n1}$ is discharged and resetted. When the switch $SW_{n1}$ is opened, the integrating circuit $10_n$ integrates a charge input from the photodiode $PD_n$ at the input terminal in the capacitor $C_{n1}$, and outputs a signal voltage corresponding to the integrated charge from the output terminal. The switch $SW_{n1}$ is opened/closed on the basis of a reset signal RS1 output from the timing control circuit 300.

A series circuit of the switch $SW_{n2}$ and capacitor $C_{n2}$ is connected in this order between the output terminal of the integrating circuit $10_n$ and the input terminal of the integrating circuit $20_n$. The switch $SW_{n2}$ is turned on/off on the basis of a control signal SWCNT output from the timing control circuit 300.

The integrating circuit $20_n$ comprises a parallel circuit of an amplifier $A_{n2}$, capacitor $C_{n3}$, and switch $SW_{n3}$, between its input and output terminals. When the switch $SW_{n3}$ is closed, the capacitor $C_{n3}$ is discharged and resetted. When the switch $SW_{n3}$ is opened, the integrating circuit $20_n$ integrates a charge input from the capacitor $C_{n2}$ at the input terminal in the capacitor $C_{n3}$, and outputs a signal voltage corresponding to the integrated charge from the output terminal. The switch $SW_{n3}$ is opened/closed on the basis of a reset signal RS2 output from the timing control circuit 300.

The sample and hold circuit $30_n$ comprises a switch $SW_{n4}$ and amplifier $A_{n3}$ in turn between the input and output terminals, and the node between the switch $SW_{n4}$ and amplifier $A_{n3}$ is connected to ground via a capacitor $C_{n4}$. The sample and hold circuit $30_n$ stores the signal voltage output from the integrating circuit $20_n$ in the capacitor $C_{n4}$ when the switch $SW_{n4}$ is closed, holds the signal voltage in the capacitor $C_{n4}$ after the switch $SW_{n4}$ is opened, and outputs that signal voltage via the amplifier $A_{n3}$.

Switches $SW_{n5}$ are inserted between the output terminals of the sample and hold circuits $30_n$ and the input terminal of the A/D conversion circuit 400. The respective switches $SW_{n5}$ are closed sequentially on the basis of a control signal output from the shift register 500, and sequentially output signal voltages output from the respective sample and hold circuits 30$_n$ to the A/D conversion circuit 400.

The maximum value detection circuit 100 receives signal voltages $V_{n1}$ output from the respective integrating circuits 10$_n$, detects a maximum voltage value $V_{max1}$ as their maximum value, and outputs that voltage value to the timing control circuit 300. The maximum value detection circuit 200 receives signal voltages $V_{n2}$ output from the respective sample and hold circuits 30$_n$, detects a maximum voltage value $V_{max2}$ as their maximum value, and outputs that voltage value to the A/D conversion circuit 400.

The timing control circuit 300 receives the maximum voltage value $V_{max1}$ output from the maximum value detection circuit 100, and outputs the reset signal RS1 for controlling to open/close the switches $SW_{n1}$, the control signal SWCNT for controlling to open/close the switches. $SW_{n2}$, and the reset signal RS2 for controlling to open/close the switches $SW_{n3}$.

The A/D conversion circuit 400 receives the maximum voltage value $V_{max2}$ output from the maximum value detection circuit 200, and sets this maximum voltage value $V_{max2}$ as an A/D conversion range. The A/D conversion circuit 400 sequentially receives signal voltages $V_{n2}$ output from the sample and hold circuits 30$_n$ via the switches $SW_{n5}$, converts the signal voltages (analog signals) into digital signals, and outputs the digital signals.

Figure 2:
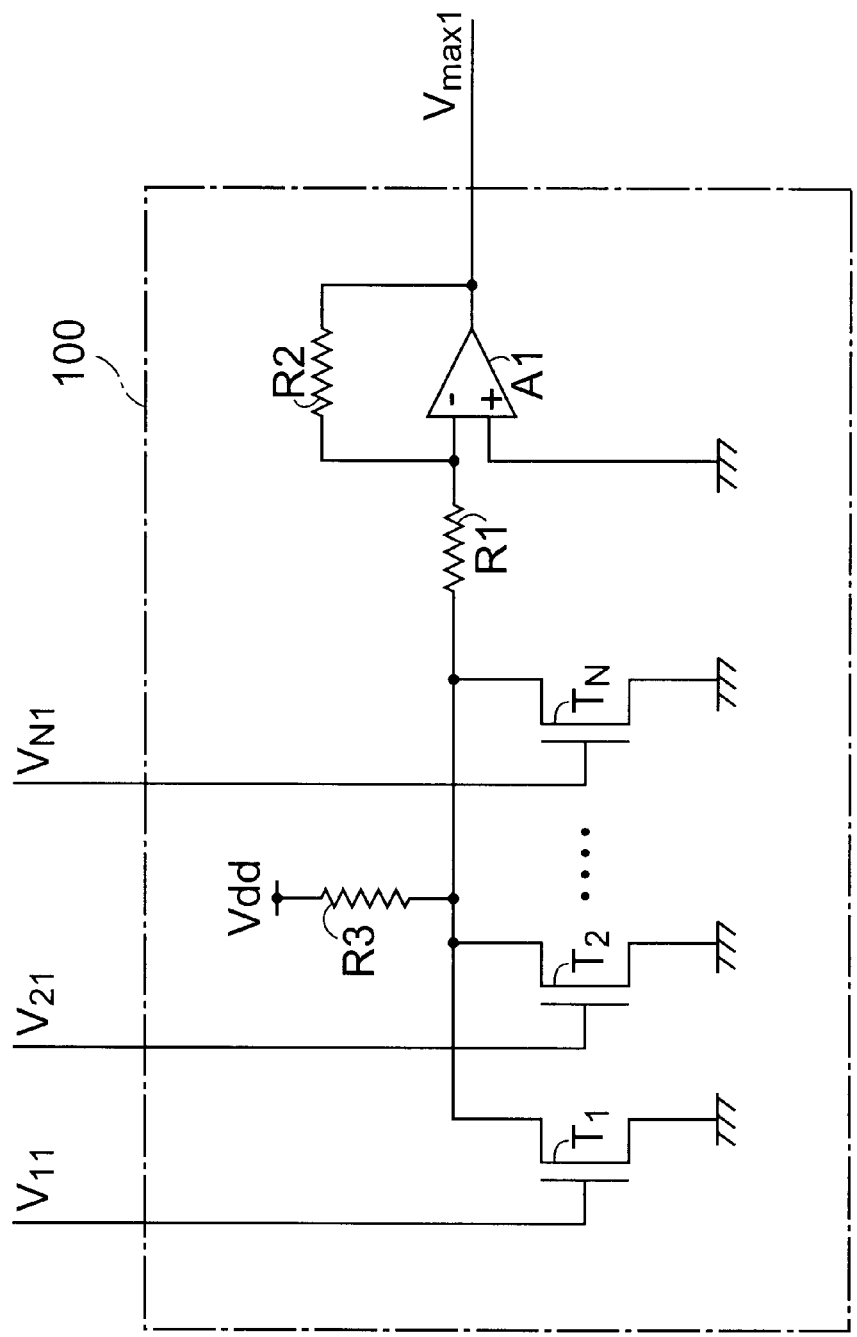
FIG. 2 is a circuit diagram of a maximum value detection circuit in the solid-state imaging device according to the embodiment of the present invention.

FIG. 2 is a circuit diagram of the maximum value detection circuit 100 in the solid-state imaging device according to this embodiment. Note that the maximum value detection circuit 200 also has the same arrangement. The maximum value detection circuit 100 comprises NMOS transistors $T_1$ to $T_N$, resistors R1 to R3, and a differential amplifier A1. The source terminal of each transistor $T_n$ is connected to ground, and the drain terminal of the transistor $T_n$ is connected to a power supply voltage Vdd via the resistor R3 and also to the inverting input terminal of the differential amplifier A1 via the resistor R1. The gate terminal of the transistor $T_n$ is connected to the output terminal of the integrating circuit 10$_n$, and receives a signal voltage $V_{n1}$. The feedback resistor R2 is inserted-between the inverting input terminal and output terminal of the differential amplifier A1, the non-inverting input terminal of which is connected to ground.

In the maximum value detection circuit 100, signal voltages $V_{n1}$ output from the respective integrating circuit 10$_n$ are input to the gate terminals of the transistors $T_n$, and a potential corresponding to the maximum value of the signal voltages $V_{n1}$ appears at the drain terminal of the transistor $T_n$. The potential at the drain terminal is amplified by the differential amplifier A1 by a gain corresponding to the ratio of the resistances of the resistors R1 and R2, and the amplified voltage value is output as the maximum voltage value $V_{max1}$ from the output terminal.

Figure 3:
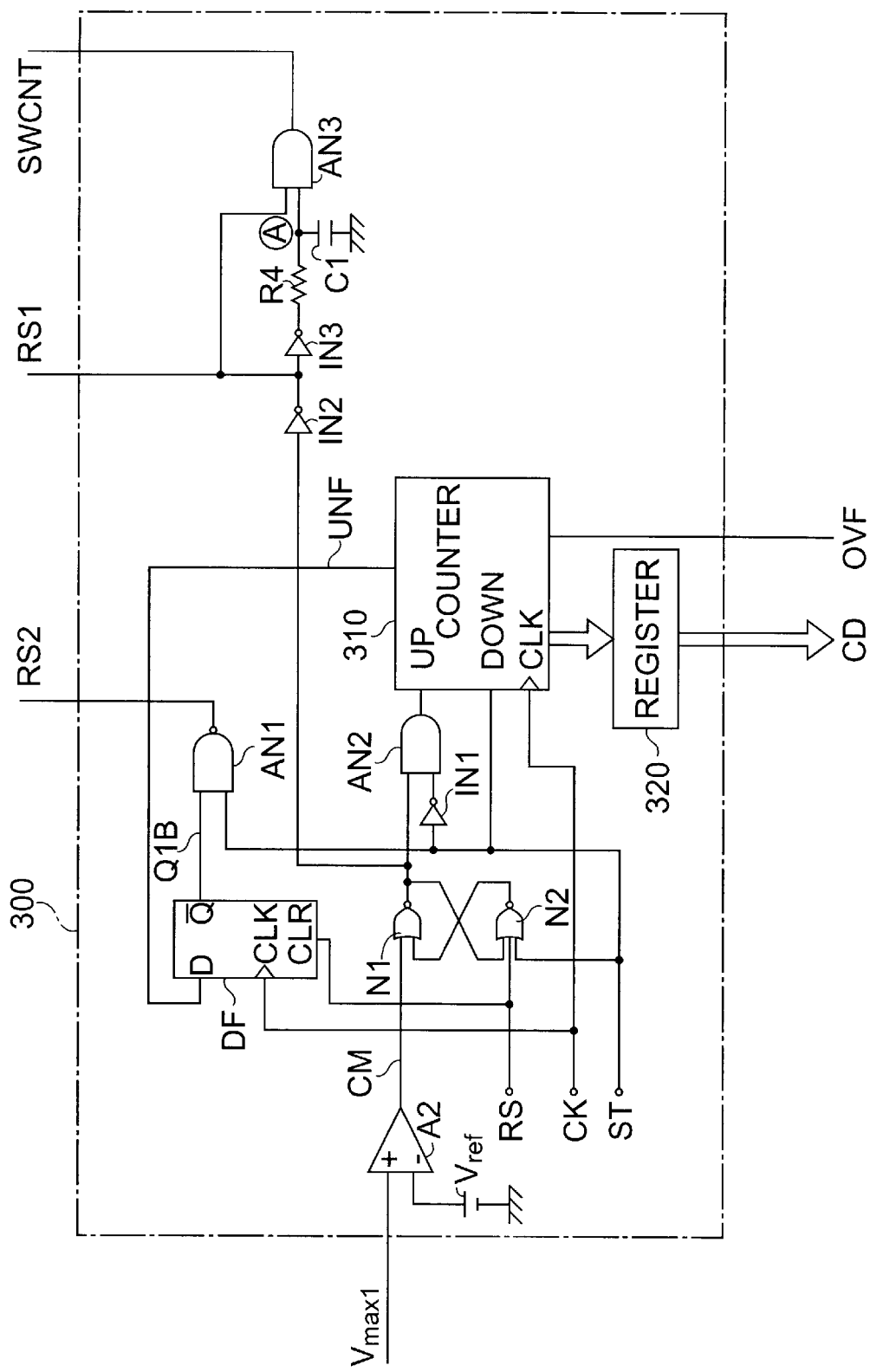
FIG. 3 is a circuit diagram of a timing control circuit in the solid-state imaging device according to the embodiment of the present invention.

FIG. 3 is a circuit diagram of the timing control circuit 300 in the solid-state imaging device according to this embodiment. The timing control circuit 300 comprises a comparator A2, NOR circuits N1 and N2, NAND circuit AN1, AND circuits AN2 and AN3, inverter circuits IN1 to IN3, resistor R4, capacitor C1, D-flip-flop DF, counter circuit 310, and register circuit 320.

The comparator A2 compares the maximum voltage value $V_{max1}$ output from the maximum value detection circuit 100 with a reference voltage $V_{ref}$, and outputs a comparison signal CM of logic "H" when the maximum voltage value $V_{max1}$ is larger than the reference voltage $V_{ref}$. Note that the reference voltage $V_{ref}$ is set at a voltage lower than a maximum value that the maximum voltage value $V_{max1}$ can assume.

The output terminal of the comparator A2 is connected to one input terminal of NOR circuit N1. The NOR circuit N1 and the other NOR circuit N2 constitute an RS flip-flop circuit, and the remaining two input terminals of the NOR circuit N2 receive a reset signal RS and start signal ST. A switching signal CSW is output from the output terminal of the NOR circuit N1. The inverter circuit IN2 generates the reset signal RS1 by inverting the switching signal CSW.

The D-flip-flop DF receives an underflow signal UNF from the counter circuit 310 at its data input terminal D, a sync clock signal CK of a relatively high frequency at its clock input terminal CLK, and the reset signal RS at its reset input terminal CLR. The NAND circuit AN1 generates the reset signal RS2 by logically multiplying an inverted output Q1B of the D-flip-flop DF and the start signal ST, and logically inverting the AND.

The AND circuit AN2 logically multiplies the inverted signal of the start signal ST output from the inverter circuit IN1, and the switching signal CSW, and supplies its output signal to an up-count control input terminal UP of the counter circuit 310. Furthermore, the counter circuit 310 receives the start signal ST at its down-count control input terminal DOWN, and the sync clock signal CK at its clock input terminal CLK. When the up-count control input terminal UP is at logic "H" and the down-count control input terminal DOWN is at logic "L", the counter circuit 310 counts up in synchronism with the sync clock signal CK, and makes the register circuit 320 hold and output its count value data CD. When the counter circuit 310 has overflowed, it outputs overflow data OVF. On the other hand, when the up-count control input terminal UP is logic "L" and the down-count control input terminal DOWN is logic "H", the counter circuit 310 counts down in synchronism with the sync clock signal CK, and outputs its count value data CD via the register circuit 320. When the counter circuit 310 has underflowed, it outputs underflow data UNF.

The inverter circuit IN3 logically inverts the reset signal RS1 output from the inverter circuit IN2, and inputs the inverted logic signal to one input terminal of the AND circuit AN3 via the resistor R4. The one input terminal of the AND circuit AN3 is connected to ground via the capacitor C1, and the other input terminal receives the reset signal RS1. The AND circuit AN3 logically multiplies the logic signals input at the two input terminals, and outputs the AND as the control signal SWCNT. The inverter circuit IN3, resistor R4, capacitor C1, and AND circuit AN3 constitute a circuit for detecting the leading edge of the reset signal RS1. That is, the control signal SWCNT output from the AND circuit AN3 changes to logic "H" from the time at which the reset signal RS1 rises from logic "L" to logic "H" for a time period defined by the resistance of the resistor R4 and the capacitance of the capacitor C1.

Figure 4:
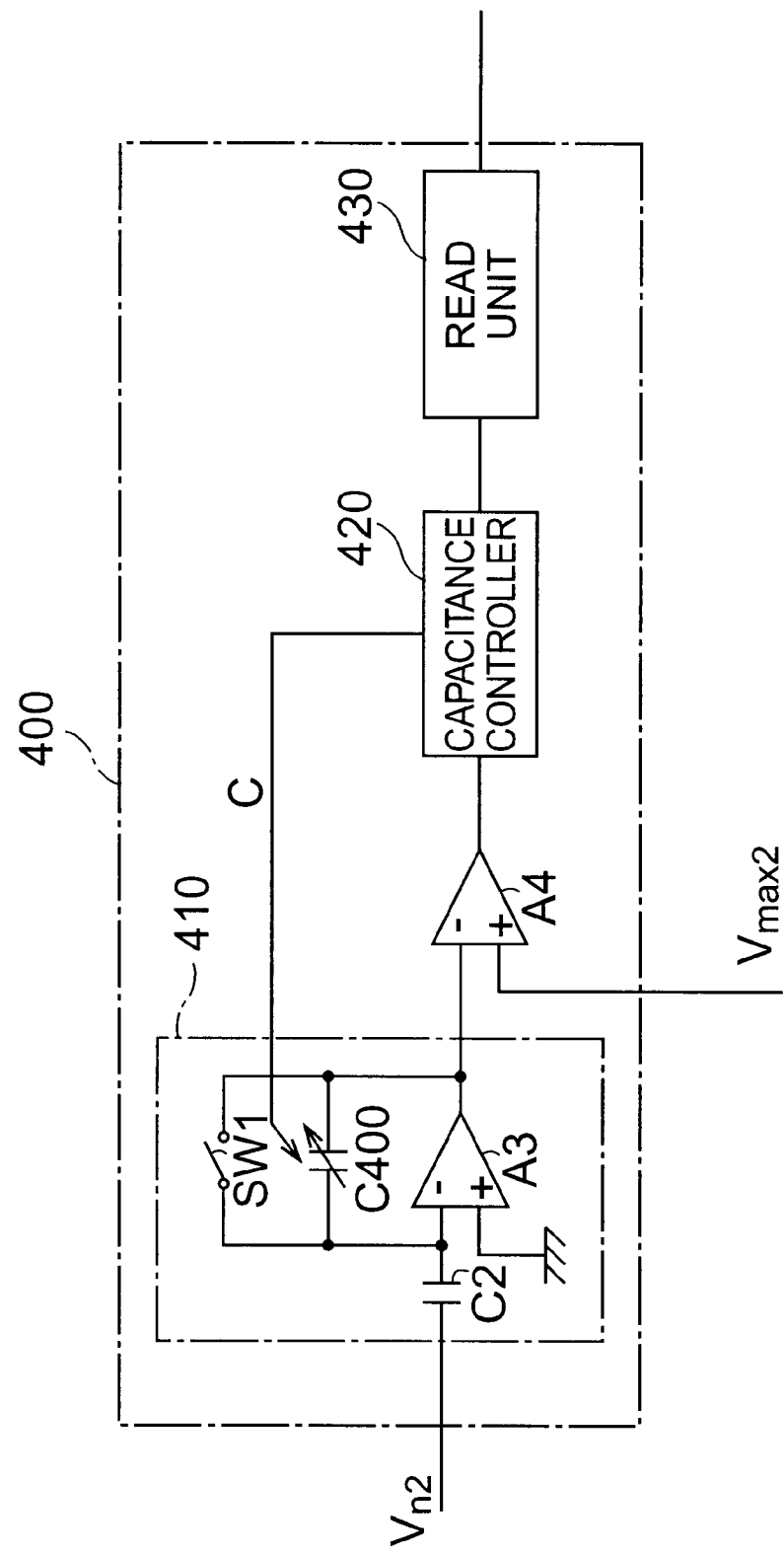
FIG. 4 is a circuit diagram of an A/D conversion circuit in the solid-state imaging device according to the embodiment of the present invention.

FIG.4 is a circuit diagram of the A/D conversion circuit 400 in the solid-state imaging device according to this embodiment. The A/D conversion circuit 400 comprises a variable capacitance integrating circuit 410, comparator A4, capacitance controller 420, and read unit 430.

The variable capacitance integrating circuit 410 comprises a capacitor C2, amplifier A3, variable capacitance unit C400, and switch SW1. The amplifier A3 receives signal voltages $V_{n2}$, which are output from the sample and hold circuits 30$_n$ and reach in turn via the switches $SW_{n5}$, at the inverting input terminal via the capacitor C2. The non-inverting input terminal of the amplifier A3 is connected to ground. The variable capacitance unit C400 has a variable and controllable capacitance, is inserted between the inverting input terminal and output terminal of the amplifier A3, and integrates a charge in accordance with the input signal voltages. The switch SW1 is inserted between the inverting input terminal and output terminal of the amplifier A3, makes the variable capacitance unit C400 integrate a charge when it is opened, and resets a charge integrated on the variable capacitance unit C400 when it is closed. The variable capacitance integrating circuit 410 receives signal voltages output in turn from the output terminals of the switches $SW_{n5}$, integrates the signal voltages in accordance with the capacitance of the variable capacitance unit C400, and outputs an integration signal as the integration result.

The comparator A4 receives the integration signal output from the variable capacitance integrating circuit 410 at its inverting input terminal, and the maximum voltage value $V_{max2}$ output from the maximum value detection circuit 200 at its non-inverting input terminal, compares the values of these two input signals, and outputs a comparison result signal as a result of comparison.

The capacitance controller 420 receives the comparison result signal output from the comparator A4, outputs a capacitance instruction signal C for controlling the capacitance of the variable capacitance unit C400 on the basis of this comparison result signal, and outputs a first digital signal corresponding to the capacitance of the variable capacitance unit C400 when it determines based on the comparison result signal that the value of the integration signal matches the maximum voltage value $V_{max2}$ at a predetermined resolution.

The read unit 430 receives the first digital signal output from the capacitance controller 420, and outputs a second digital signal corresponding to this first digital signal. The second digital signal indicates a value obtained by removing an offset value of the variable capacitance integrating circuit 410 from the value of the first digital signal. The read unit 430 is, for example, a memory, receives the first digital signal as an address, and outputs data stored at that address of the memory as the second digital signal. The second digital signal is a light detection signal output from the solid-state imaging device according to this embodiment.

Figure 5:
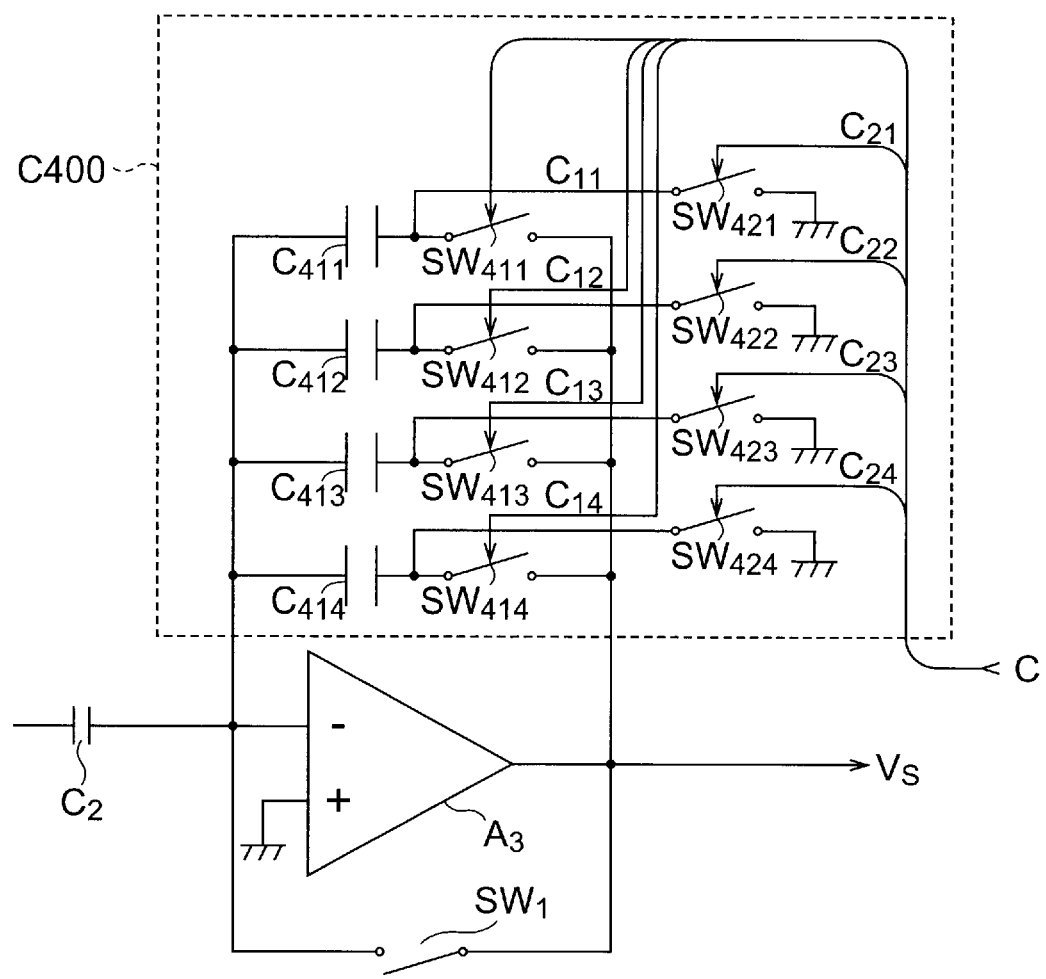
FIG. 5 is a detailed circuit diagram of a variable capacitance integrating circuit in the A/D conversion circuit.

FIG. 5 is a detailed circuit diagram of the variable capacitance integrating circuit 410 in the A/D conversion circuit 400. FIG. 5 shows the circuit arrangement comprising an A/D conversion function which has a resolution of $1/2^4 = 1/16$, and the following explanation will be given using this circuit arrangement.

As shown in FIG. 5, the variable capacitance unit C400 comprises capacitors C411 to C414, switches SW411 to SW414, and switches SW421 to SW424. The capacitor C411 and switch SW411 are cascaded, and are inserted between the inverting input terminal and output terminal of the amplifier A3. The switch SW421 is inserted between the node of the capacitor C411 and switch SW411, and the ground potential. The capacitor C412 and switch SW412 are cascaded, and are inserted between the inverting input terminal and output terminal of the amplifier A3. The switch SW422 is inserted between the node of the capacitor C412 and switch SW412, and the ground potential. The capacitor C413 and switch SW413 are cascaded, and are inserted between the inverting input terminal and output terminal of the amplifier A3. The switch SW423 is inserted between the node of the capacitor C413 and switch SW413, and the ground potential. The capacitor C414 and switch SW414 are cascaded, and are inserted between the inverting input terminal and output terminal of the amplifier A3. The switch SW424 is inserted between the node of the capacitor C414 and switch SW414, and the ground potential.

The switches SW411 to SW414 are respectively opened/closed on the basis of bits C11 to C14 of the capacitance instruction signal C output from the capacitance controller 420. The switches SW421 to SW424 are respectively opened/closed on the basis of bits C21 to C24 of the capacitance instruction signal C output from the capacitance controller 420. Capacitances $C_1$ to $C_4$ of the capacitors C411 to C414 satisfy:

$$C_1 = 2C_2 = 4C_3 = 8C_4 \qquad (1)$$

$$C_1 + C_2 + C_3 + C_4 = C_0 \qquad (2)$$

That is, the switches SW421 to SW424 remove charges integrated on the capacitors C411 to C414, and reset in integrating operation when they are closed. The capacitors C411 to C414 determine an output signal level. Since the composite capacitance of the capacitors C411 to C414 increases with increasing number of capacitors C411 to C414 that can integrate charges when the switches are closed, the output signal level becomes smaller. When the composite capacitance increases, since the output signal level is reduced, saturation can be suppressed. However, since the output signal level is small, accurate A/D conversion is disturbed. In this embodiment, the output signal level is automatically adjusted to maximize within the range that does not exceed the maximum value $V_{max2}$, as will be described later.

The operation of the solid-state imaging device according to this embodiment will be explained below. Note that a case will be explained below wherein the solid-state imaging device according to this embodiment constitutes a active distance measurement device together with one or a plurality of light-emitting diodes $LED_n$ (projection means: see FIG. 1). In the operation to be described below, background light components are removed by two processes during first and second periods T1 and T2, and a light detection signal of only spot light components projected from the light-emitting diodes LED, onto an object is output.

The light-emitting diodes $LED_n$ are turned on to stop charging of the second integrating circuits $20_n$, and to start charging (integration) of the first integrating circuits $10_n$, and the counter circuit 310 measures this charging period. The maximum voltage value $V_{max1}$ gradually rises as charging progresses, and when the maximum voltage value $V_{max1}$ has exceeded the-reference voltage $V_{ref}$, the integrating operations of the integrating circuits $10_n$ and measurement of the charging period by the counter circuit 310 stop. That is, the period from the ON timing of each light-emitting diode $LED_n$ until the integrated value of charge reaches a predetermined value is measured in association with the output from the photodiode that gives a maximum integrated value. The measured period is proportional to the intensity of the total incident light to the photodiode.

Note that the integrated value is stored in each capacitor $C_{1n}$. After the light-emitting diodes LED, are turned off, the integrating circuits $10_n$ and $20_n$ start integrating operations for the same period as the measured period. Integration during this period is proportional to the background light intensity. Therefore, upon turning on and off the light-emitting diodes $LED_n$, an output obtained by removing the background light intensity ($LED_n$=OFF) from the total incident light intensity ($LED_n$=ON) is output from each second integrating circuit $20_n$. The operation will be explained in detail below.

Figure 6:
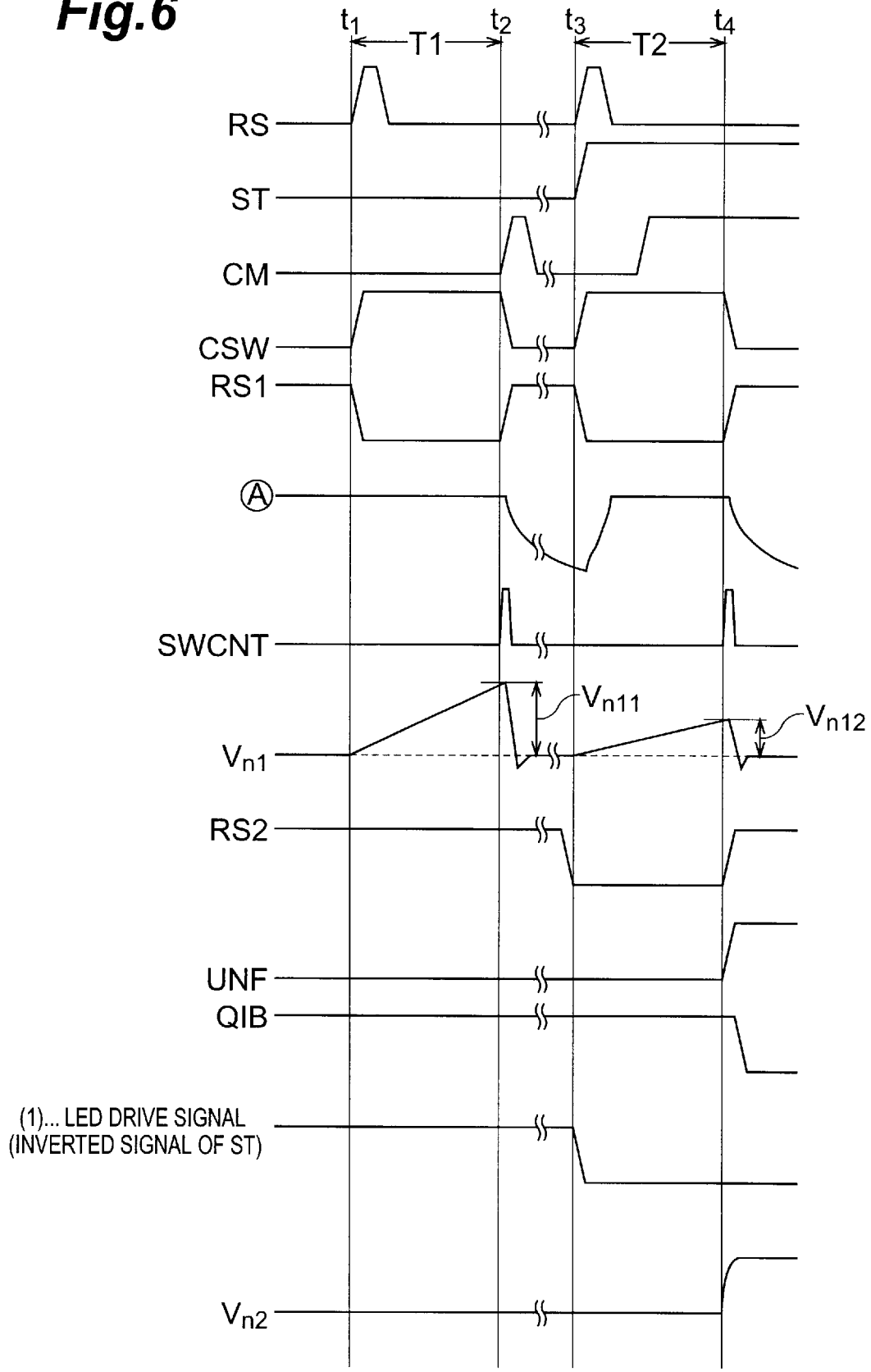
FIG. 6 is a timing chart for explaining the operation of the solid-state imaging device according to the embodiment of the present invention.

FIG. 6 is a timing chart for explaining the operation of the solid-state imaging device according to this embodiment.

During a period T1, the start signal ST is maintained at logic "L", and the light-emitting diodes $LED_n$ are driven by the inserted signal of the start signal ST to emit light. When this state is set, since the reset signal RS2 changes to logic "H", the switches $SW_{n3}$ of the integrating circuits $20_n$ are closed to stop charging of the capacitors $C_{n3}$.

When the reset signal RS instantaneously changes to logic "H" at start time t1, the switching signal CSW is inverted to logic "H" and the reset signal RS1 is inverted to logic "L" in synchronism with the signal RS. As a result, the switches $SW_{n1}$ of the integrating circuits $10_n$ are opened. Furthermore, since the up-count control input contact UP changes to logic "H" and the down-count control input contact DOWN changes to logic "L", the counter circuit 310 starts an up-count operation.

As a result, during the period T1, the photodiodes $PD_n$ receive both spot light components emitted by the light-emitting diodes $LED_n$ and reflected by an object, and background light components, and output signal currents generated according to those incident light components. Since the integrating circuits $10_n$ receive the signal currents and integrate charges on their capacitors $C_{n1}$, signal voltages $V_{n1}$ output from the output terminals of the integrating circuits $10_n$ rise gradually, the maximum voltage value $V_{max1}$ output from the maximum value detection circuit 100 also rises gradually, and the counter circuit 310 measures that charging period.

When the maximum voltage value $V_{max1}$ as a maximum value of the signal voltages $V_{n1}$ output from the integrating circuits $10_n$ has exceeded the reference voltage $V_{ref}$ at given time t2, the comparison output CM output from the comparator A2 changes to logic "H". In synchronism with this output, the switching signal CSW output from one NOR circuit N1 that forms the RS flop-flop changes to logic "L", and the reset signal RS1 is inverted to logic "H". As a result, the switches $SW_{n1}$ of the integrating circuits $10_n$ are closed, and the integrating operations of the integrating circuits $10_n$ stop. Furthermore, since the up-count control input contact UP is inverted to logic "L", the counter circuit 310 stops the count-up operation.

In this manner, the period until time t2 at which the maximum voltage value $V_{max1}$ output from the maximum value detection circuit 100 has exceeded the reference voltage $V_{ref}$ is T1. Let $V_{n11}$ be the value of a signal voltage output from the output terminal of each integrating circuit $10_n$ at time t2. Also, let $I_{ns}$ be a value corresponding to spot light components of the signal current input from each photodiode $PD_n$ to the input terminal of the integrating circuit $10_n$, and $I_{nd}$ be a value corresponding to background light components. Then, we have:

$$V_{n11}=(I_{ns}+I_{nd})\cdot T1/C_{n1} \qquad (3)$$

Furthermore, upon rising of the reset signal RS1, the control signal SWCNT changes to logic "H" for a predetermined period of time, and the switches $SW_{n2}$ are closed for the predetermined period of time, thus holding the values $V_{n11}$ of the signal voltages in the capacitors $C_{n2}$.

Furthermore, the counter circuit 310 internally holds a count value CD corresponding to the time period T1, and also makes the register circuit 320 hold it. Note that when the intensity of incident light on each photodiode $PD_n$ is weak, since the time period required until the maximum voltage value $V_{max1}$ exceeds the reference voltage $V_{ref}$ becomes long, the counter circuit 310 holds a count value CD indicating a long time period T1. Conversely, when the intensity of incident light on each photodiode $PD_n$ is strong, since the time period required until the maximum voltage value $V_{max1}$ exceeds the reference voltage $V_{ref}$ becomes short, the counter circuit 310 holds a count value CD indicating a short time period T1. Therefore, the count value CD held in the counter circuit 310 assumes a value proportional to the light intensity.

When the intensity of incident light on each photodiode $PD_n$ is very weak, and the counter circuit 310 has overflowed before the maximum voltage value $V_{max1}$ exceeds the reference voltage $V_{ref}$, the overflow signal OVF is generated, and an unmeasurable state can be externally informed.

At given time t3, the start signal ST is inverted to logic "H" and the reset signal RS simultaneously changes to logic "H". Furthermore, emission of each light-emitting diode $LED_n$ is stopped. Therefore, the switching signal CSW output from the NOR circuit N1 that forms the RS flip-flop circuit is inverted to logic "H", and the reset signal RS1 is inverted to logic "L" synchronously. Furthermore, the reset signal RS2 also changes to logic "L". That is, the switches $SW_{n1}$ of the integrating circuits $10_n$ are opened, and the switches $SW_{n3}$ of the integrating circuits $20_n$ are also opened. Furthermore, since the up-count control input contact UP changes to logic "L", and the down-count control input contact DOWN changes to logic "H", the counter circuit 310 starts a down-count operation from the held value CD.

As a result of such switching operation, the integrating circuits $10_n$ receive signal currents which are output from the photodiodes $PD_n$ and correspond to only the background light components, and integrate charges on the capacitors $C_{n1}$. The integrating circuits $20_n$ integrate charges as the differences between those on the capacitors $C_{n1}$ and $C_{n2}$ on the capacitors $C_{n3}$ according to the principle of conservation.

When the count value of the counter circuit 310 has reached zero, since the underflow signal UNF is inverted to logic "H" at that time t4, the inverted output Q1B of the D-flip-flop DF is inverted to logic "L", and the reset signal RS2 is inverted to logic "H", the switches $SW_{n3}$ are closed, and a period T2 is determined. That is, the period from time t3 to time t4 is T2. Since the period T2 is determined as a result of the count operation of the counter circuit 310, the periods T1 and T2 are equal to each other.

Let $V_{n12}$ be the value of a signal voltage output from the output terminal of each integrating circuit $10_n$ at time t4. Also, let the signal current input from each photodiode $PD_n$ to the input terminal of the integrating circuit $10_n$ correspond to only background light component. Then, we have:

$$V_{n12}=I_{nd}\cdot T1/C_{n1} \qquad (4)$$

where $I_{nd}$ is the value of the signal current input from each photodiode $PD_n$ to the input terminal of the integrating circuit $10_n$.

Since each integrating circuit $20_n$ stops integration during the period T1, and executes integration during the period T2, a charge given by:

$$(V_{n11}-V_{n12})\cdot C_{n2}=V_{n2}\cdot C_{n3} \qquad (5)$$

is integrated on the capacitors $C_{n2}$ and $C_{n3}$ in accordance with the principle of conservation of charge.

Substituting equations (3) and (4) in equation (5) and letting. T=T1=T2 yields a signal voltage $V_{n2}$ which is output from the output terminal of each integrating circuit $20_n$ and is given by:

$$V_{n2} I_{ns} \cdot T \cdot C_{n2}/(C_{n1} \cdot C_{n3}) \quad (6)$$

If the capacitances of the capacitors $C_{n2}$ and $C_{n3}$ are equal to each other, the above equation is rewritten as:

$$V_{n2} = I_{ns} \cdot T/C_{n1} \quad (7)$$

After that, the switches $SW_{n4}$ of the sample and hold circuits $30_n$ are closed for a predetermined period of time, and the signal voltages $V_{n2}$ output from the output terminals of the integrating circuits $20_n$ are held in the capacitors $C_{n4}$. The signal voltages $V_{n2}$ held in the capacitors $C_{n4}$ become the outputs of the sample and hold circuits 30, via the amplifiers $A_{n3}$. The signal voltages output from the sample and hold circuits $30_n$ are input to the maximum value detection circuit 200 to detect a maximum voltage value $V_{max2}$, and are input in turn to the A/D conversion circuit 400 since the shift register 500 closes the switches $SW_{n5}$.

The operation of the A/D conversion circuit 400 will be described below using FIGS. 7A to 7D. At time t4 at which the aforementioned period T2 ends, the switch SW1 of the variable capacitance integrating circuit 410 is closed, and the variable capacitance integrating circuit 410 is reset. Also, the switches SW411 to SW414 of the variable capacitance integrating circuit 410 are closed, and the switches SW421 to SW424 are opened to set the capacitance of the variable capacitance unit C400 at $C_0$.

At certain time after time t4, the switch SW1 is opened and the switch $SW_{15}$ is also opened. A signal voltage $V_{12}$ output from the sample and hold circuit $30_1$ is input to the variable capacitance integrating circuit 410 via the switch $SW_{15}$. When the signal voltage $V_{12}$ is input to the capacitor C2 of the variable capacitance integrating circuit 410, a charge Q corresponding to the value of that signal voltage $V_{12}$ and the capacitance $C_0$ of the variable capacitance unit C400 flows into the variable capacitance unit C400 (see FIG. 7A). At this time, a value $V_{sa}$ of an integration signal output from the variable capacitance integrating circuit 410 is given by:

$$V_{sa} = V_{12} = Q/C_0 \quad (8)$$

Figure 7A:
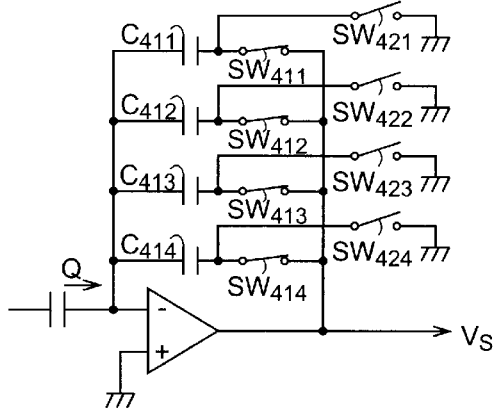
FIGS. 7A, 7B, 7C, and 7D are circuit diagrams for explaining the operation of the A/D conversion circuit.
Figure 7B:
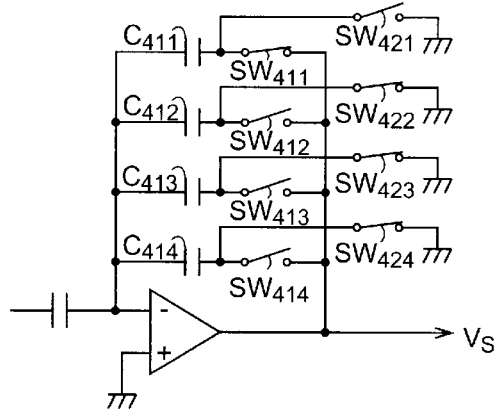

Subsequently, the capacitance controller 420 opens the switches SW412 to SW414 of the variable capacitance unit C400, and then closes the switches SW422 to SW424 (see FIG. 7B). As a result, the capacitance of the variable capacitance unit C400 becomes $C_1$, and a value $V_{sb}$ of an integration signal output from the variable capacitance integrating circuit 410 is given by:

$$V_{sb} = Q/C_1 \quad (9)$$

This integration signal is input to the comparator 4A, and its value is compared with the maximum voltage value $V_{max2}$.

Figure 7C:
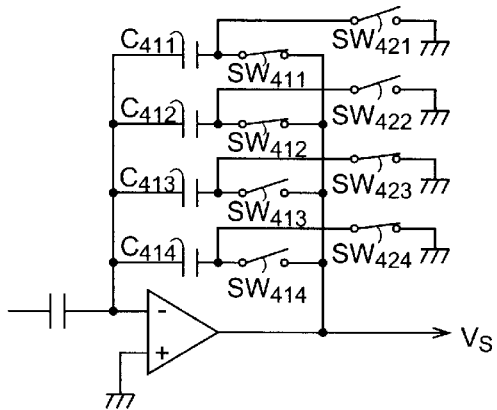

If $V_{sb} > V_{max2}$, the capacitance controller 420 further opens the switch SW422 of the variable capacitance unit C400 in response to this comparison result, and then closes the switch SW412 (see FIG. 7C). As a consequence, the capacitance of the variable capacitance unit C400 becomes $C_1 + C_2$, and a value $V_{sc}$ of an integration signal output from the variable capacitance integrating circuit 410 is given by:

$$V_{sc} = Q/(C_1 + C_2) \quad (10)$$

This integration signal is input to the comparator 4A, and its value is compared with the maximum voltage value $V_{max2}$.

Figure 7D:
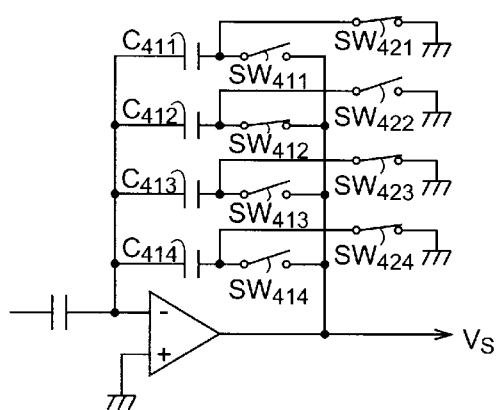

On the other hand, if $V_{sb} < V_{max2}$, the capacitance controller 420 further opens the switches SW411 SW422 of the variable capacitance unit C400 in response to this comparison result, and then closes the switches SW412 and SW421 (see FIG. 7D). As a result, the capacitance of the variable capacitance unit C400 becomes $C_2$, and a value $V_{sd}$ of an integration signal output from the variable capacitance integrating circuit 410 is given by:

$$V_{sd} = Q/C_2 \quad (11)$$

This integration signal is input to the comparator 4A, and its value is compared with the maximum voltage value $V_{max2}$.

After that, a feedback loop including the variable capacitance integrating circuit 410, comparator A4, and capacitance controller 420 similarly repetitively sets the capacitance of the-variable capacitance unit C400 and compares the value of the integration signal and the maximum voltage value $V_{max2}$ until the capacitance controller 420 determines that the value of the integration signal and the maximum voltage value $V_{max2}$ match at a predetermined resolution. Upon completion of the capacitance control for all the capacitors C411 to C414 of the variable capacitance unit C400 in this way, the capacitance controller 420 outputs a digital signal corresponding to the final capacitance of the variable capacitance unit C400 to the read unit 430.

The read unit 430 receives the digital signal output from the capacitance controller 420 as an address, and outputs digital data stored at that address of the memory as a light detection signal-of the solid-state imaging device according to this embodiment. In this manner, a signal voltage $V_{12}$ corresponding to the intensity of incident spot light on the first photodiode $PD_n$ is converted into a digital signal-by the A/D conversion circuit 400, and that digital signal is output as a light detection signal. Similarly, signal voltages $V_{n2}$ corresponding to the intensity of incident spot light on the second and subsequent photodiodes $PD_n$ are converted into digital signals by the A/D conversion circuit 400, and these digital signals are sequentially output as light detection signals.

Since the maximum value of the signal voltages $V_{n2}$ input to the variable capacitance integrating circuit 410 is the maximum voltage value $V_{max2}$, and the maximum value of the capacitances of the variable capacitance unit C400 is $C_0$, the maximum value of the charge Q that flows into the variable capacitance unit C400 is $V_{max2} \cdot C_0$ from equation (8). If a given n-th signal voltage $V_{n2}$ assumes the maximum voltage value $V_{max2}$, all the switches SW411 to SW414 of the variable capacitance unit C400 are closed to set the capacitance of the variable capacitance unit C400 at $C_0$. On the other hand, if another n-th signal voltage $V_{n2}$ assumes a value smaller than the maximum voltage value $V_{max2}$, since the charge Q that flows into the variable capacitance unit C400 is smaller than $V_{max2} \cdot C_0$, one of the switches SW411 to SW414 of the variable capacitance unit C400 is opened, so that the integration signal output from the variable capacitance integrating circuit 410 becomes equal to the maximum voltage value $V_{max2}$.

As described above, the maximum voltage value $V_{max2}$ which is output from the maximum value detection circuit 200 and is input to the comparator A4 defines the maximum value of the signal voltages $V_{n2}$ that the A/D conversion circuit 400 can A/D-convert without being saturated, i.e., the A/D conversion range. In addition, since one of the signal voltages $V_{n2}$ input to the A/D conversion circuit 400 assumes the maximum voltage value $V_{max2}$, the entire A/D conversion range can be effectively utilized. That is, the solid-state imaging device according to this embodiment is not saturated even when the intensity of incident light is large, and can assure a high A/D conversion resolution even when the intensity of incident light is small.

When an image of only spot light components is obtained by subtracting the image sensing result of background light components from that of the spot light components and background light components like in a case wherein the photosensitive device is used in the distance measurement device, and when the background light components of incident light on each photodiode $PD_n$ are larger than the spot light components, a digital signal output from the A/D conversion circuit based on the spot light components obtained as the difference can have high resolution.

As described above, according to the photosensitive device, the first integrating circuits integrate charges in accordance with signal currents output from the intensities of incident light on the respective photosensitive elements, and output signal voltages. The first maximum value detection circuit detects the maximum value of the signal voltages output from the N first integrating circuits. The A/D conversion circuit sets its A/D conversion range on the basis of the maximum value detected by the first maximum value detection circuit, converts the signal voltages output from the N first integrating circuits into digital signals, and outputs the digital signals. Therefore, the photosensitive device is never saturated even when the intensity of incident light is large, and can assure a high A/D conversion resolution even when the intensity of incident light is small.

When the photosensitive device further comprises the second integrating circuits, switches, capacitors, and second maximum value detection circuit, the second integrating circuits receive signal currents output in accordance with the the intensities of incident light on the respective photosensitive elements, integrate charges based on the signal currents, and output signal voltages. The second maximum value detection circuit detects the maximum value of the signal voltages output from the N second integrating circuits. The timing control circuit controls the operation timings of the first and second integrating circuits on the basis of the maximum value detected by the second maximum value detection circuit, and various noise components are removed from a signal voltage output from each second integrating circuit.

When the photosensitive device is used together with projection means for projecting spot light toward an object, and the background light components of incident light on each photosensitive element are larger than the spot light components, each first integrating circuit obtains an image of only the spot light components by subtracting the image sensing result of the background light components from that of the spot light components and background light components. A digital signal output from the A/D conversion circuit based on the spot light components obtained as the difference can have high resolution.

Note that the second largest numerical value may be used in place of the maximum value $V_{max1}$ or $V_{max2}$, or a numerical value of an appropriate order may be used if necessary.

What is claimed is:

1. A photosensitive device comprising N first integrating circuits arranged in correspondence with a one- or two-dimensional array of N ($N \geq 2$) photosensitive elements, a first detection circuit for selecting and detecting a specific signal from N signal voltages output from said N first integrating circuits, an A/D conversion circuit for converting the signal voltages output from said N first integrating circuits into digital signals on the basis of the signal detected by said first detection circuit, and outputting the digital signals, N second integrating circuits arranged in correspondence with the N photosensitive elements, switches and capacitors inserted in turn between N sets of second integrating circuits and first integrating circuits, a second detection circuit for selecting and detecting a specific signal from signal voltages output from said N second integrating circuits, and a timing control circuit for controlling operation timings of said first and second integrating circuits on the basis of the signal detected by said second detection circuit.

2. A photosensitive device according to claim 1, characterized in that said photosensitive device is applied to a solid-state imaging device which is used together with projection means for projecting spot light toward an object, said timing control circuit controls said N second integrating circuits to integrate first charge amounts on the basis of signal currents output from the N photosensitive elements illuminated by spot light components and background light components during a first period in which the spot light is projected, and controls said N second integrating circuits to integrate second charge amounts on the basis of signal currents output from the N photosensitive elements illuminated by the background light components and said N first integrating circuits to integrate charge amounts as differences between the first and second charge amounts during a second period in which said projection means does not project the spot light onto the object.

3. A photosensitive device according to claim 1, characterized in that the specific signal detected by said first detection circuit is a signal having a maximum value.

4. A photosensitive device according to claim 1, characterized in that the specific signal detected by said second detection circuit is a signal having a maximum value.

* * * * *